United States Patent [19]

Westwick

[11] Patent Number: 5,049,831
[45] Date of Patent: Sep. 17, 1991

[54] SINGLE-ENDED INPUT TO DIFFERENTIAL OUTPUT AMPLIFIER WITH INTEGRAL TWO-POLE FILTER

[75] Inventor: Alan L. Westwick, Austin, Tex.

[73] Assignee: Motorola, Inc., Schaumburg, Ill.

[21] Appl. No.: 501,057

[22] Filed: Mar. 29, 1990

[51] Int. Cl.$^5$ .............................................. H03F 3/45
[52] U.S. Cl. .................................... 330/107; 330/258; 330/294
[58] Field of Search ............... 330/107, 258, 260, 294, 330/302, 303, 304, 306, 307; 307/520; 333/172

[56] References Cited

U.S. PATENT DOCUMENTS

| | | | |
|---|---|---|---|
| 4,241,428 | 12/1980 | Berni et al. | 330/258 X |
| 4,242,741 | 12/1980 | Parrish | 330/258 X |
| 4,573,020 | 2/1986 | Whatley | 330/258 |
| 4,697,152 | 9/1987 | Westwick | 330/9 |
| 4,720,686 | 1/1988 | Westwick | 330/258 |
| 4,782,305 | 11/1988 | Westwick et al. | 330/107 |

Primary Examiner—James B. Mullins
Attorney, Agent, or Firm—Paul J. Polansky

[57] ABSTRACT

A single-ended input to differential output amplifier performs a predetermined transfer function on an input signal substantially independently of nonlinearities in component values. The input signal and a first reference voltage are coupled to a circuit network, which is coupled to a fully differential operational amplifier, to implement the predetermined transfer function. A common mode voltage between positive and negative output signals of the operational amplifier is sensed and fed back to the operational amplifier so that the operational amplifier may set the common mode voltage to a second reference voltage. The circuit network has first, second, and third capacitors, the third capacitor coupled between a positive input terminal and the first reference voltage. To reduce circuit area, the third capacitor is coupled between a positive input terminal and the negative output terminal of the operational amplifier, allowing either the first capacitor or the second capacitor to be halved in size to again implement the predetermined transfer function.

11 Claims, 1 Drawing Sheet

SINGLE-ENDED INPUT TO DIFFERENTIAL OUTPUT AMPLIFIER WITH INTEGRAL TWO-POLE FILTER

FIELD OF THE INVENTION

This invention relates generally to electronic amplifiers, and more particularly, to amplifier circuits which receive a signal referenced to a fixed potential and provide a differential output signal while performing a filtering function.

BACKGROUND OF THE INVENTION

Several problems arise when analog filter/amplifier circuits are implemented as part of integrated circuits. First, single-ended signals are often recived at the input of the integrated circuit. However, internal to the integrated circuit, differential signals offer improved transmission and noise characteristics and are more suitable for use in amplification and signal conditioning. Second, in semiconductor integrated circuits resistors are typically formed as a diffusion of one conductivity type in a substrate of a second conductivity type. The diffusion-substrate interface forms a PN junction. The substrate is typically biased to keep the PN junction reverse biased under normal conditions. However, the width of the depletion region of the PN junction changes with changes in bias conditions, affecting the crosssection of the resistor and hence the value of the resistance. For some analog circuits such as amplifier/filters, the change in the resistance of a resistor with changes in bias conditions affects the frequency response and distortion of the circuit. Third, integrated circuit area must be minimized to reduce cost. In amplifier/filter circuits with feedback and multiple pole filtering, the area required for the components implementing the transfer function can be significant.

BRIEF DESCRIPTION OF THE INVENTION

Accordingly, it is an object of the present invention to provide an improved single-ended input to differential output amplifier with an integral two-pole filter.

It is another object of the present invention to provide an improved circuit for performing a predetermined transfer function on a single-ended input signal and which minimizes circuit area.

It is yet another object of the present invention to provide a filter circuit with improved tolerance to nonlinearities in component values.

In carrying out these and other objects of the invention, there is provided, in one form, a circuit which receives a single-ended input signal and implements a predetermined transfer function to provide a differential output signal. The circuit comprises an amplifier, a first circuit portion, a second circuit portion, a capacitor, and a common mode sensing portion. The amplifier has first and second input terminals, first and second output terminals, and a common mode feedback terminal. The first circuit portion is coupled to the amplifier, receives a reference voltage, and implements a part of the predetermined transfer function. A second circuit portion is coupled to the amplifier, receives the single-ended input signal, and further implements the predetermined transfer function. The capacitor is coupled between the first circuit portion and the second circuit portion to further implement the predetermined transfer function by utilizing a voltage between the single-ended input signal and the reference voltage. The common mode sensing portion senses a common mode voltage between the first output terminal of the amplifier and the second output terminal of the amplifier.

These and other objects, features and advantages will be more clearly understood from the following detailed description taken in conjunction with the accompanying drawings.

BETAILED DESCRIPTION OF THE INVENTION

Figure 1:
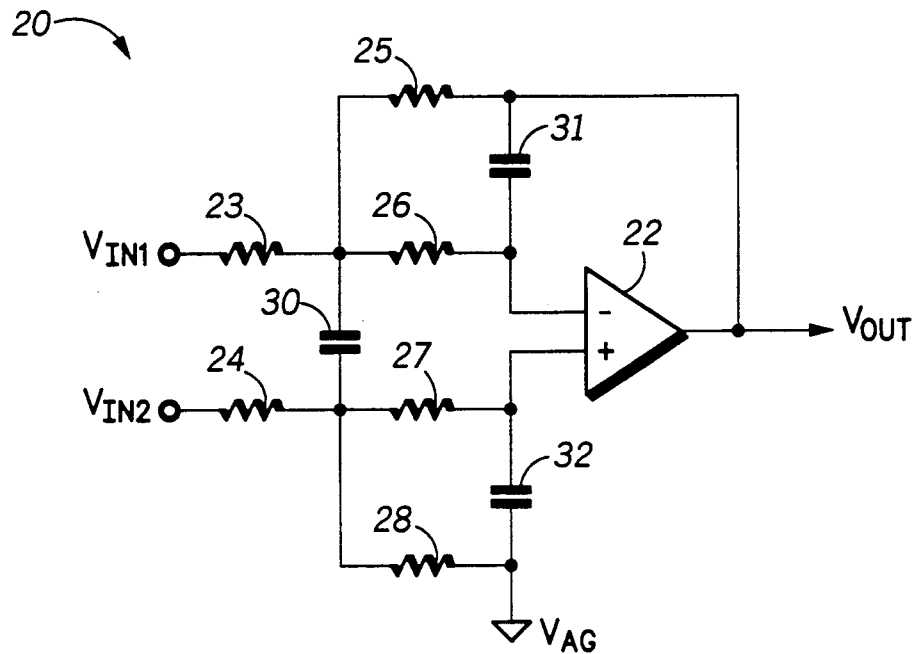
FIG. 1 illustrates in schematic form a differential input to single-ended output amplifier filter circuit known in the art.

FIG. 1 illustrates in schematic form a differential input-single-ended output amplifier filter circuit 20. Circuit 20 is taught by Westwick et al. in U.S. Pat. No. 4,782,305 entitled "Differential Input-Single Output Two Pole Filter Implemented by a Single Amplifier" and assigned to the assignee hereof. Circuit 20 comprises an operational amplifier 22, resistors 23-28, and capacitors 30-32. Operational amplifier 22 has a negative input terminal, a positive input terminal, and an output terminal providing a signal labelled "$V_{OUT}$". Resistor 23 has a first terminal for receiving a signal labelled "$V_{IN1}$", and has a second terminal. Resistor 24 has a first terminal for receiving a signal labelled "$V_{IN2}$", and has a second terminal. Resistor 25 has a first terminal connected to the second terminal of resistor 23, and has a second terminal connected to the output terminal of operational amplifier 22. Resistor 26 has a first terminal connected to the second terminal of resistor 23, and has a second terminal connected to the negative input terminal of operational amplifier 22. Resistor 27 has a first terminal connected to the second terminal of resistor 24, and has a second terminal connected to the positive input terminal of operational amplifier 22. Resistor 28 has a first terminal connected to the second terminal of resistor 24, and has a second terminal connected to a reference voltage labelled "$V_{AG}$". Capacitor 30 has a first terminal connected to the second terminal of resistor 23, and has a second terminal connected to the second terminal of resistor 24. Capacitor 31 has a first terminal connected to the output terminal of operational amplifier 22, and a second terminal connected to the negative input terminal of operational amplifier 22. Capacitor 32 has a first terminal connected to the positive input terminal of operational amplifier 22, and has a second terminal connected to $V_{AG}$. For purposes of illustration, assume that circuit 20 is implemented with resistors 23 and 24 having equal values, resistors 26 and 27 having equal values, resistors 25 and 28 having equal values, and capacitors 31 and 32 having equal values.

Circuit 20 provides a two-pole filtering function with a relatively flat passband frequency. Attenuation at a predetermined cutoff frequency is vary sharp and distinct for circuit 20. In can be readily shown that the gain transfer function for circuit 20 in the s domain may be represented as:

$$V_{OUT} = (V_{IN1} - V_{IN2})[(A)(b_0)/(s^2 + b_1 s + b_0)] \quad (1)$$

where:

$$b_0 = (1)/[(R_{25})(R_{26})(2)(C_{30})(C_{31})] \quad (2)$$

wherein $R_{25}$ and $R_{26}$ are the resistive values of resistors 25 and 26, respectively, and $C_{30}$ and $C_{31}$ are the capacitive values of capacitors 30 and 31, respectively. The expression "$b_1$" may be defined as $$b_1 = [1/((2)(C_{30}))][(1/R_{23}) + (1/R_{25}) + (1/R_{26})] \quad (3)$$

wherein $R_{23}$ is the resistive value of resistor 23. The term "A" in equation one is the D.C. gain of circuit 20 and is equal to $(-R_{25}/R_{23})$. The D.C. gain is determined by a single resistive ratio and may be made very stable when implemented with conventional diffusion resistors.

Figure 2:
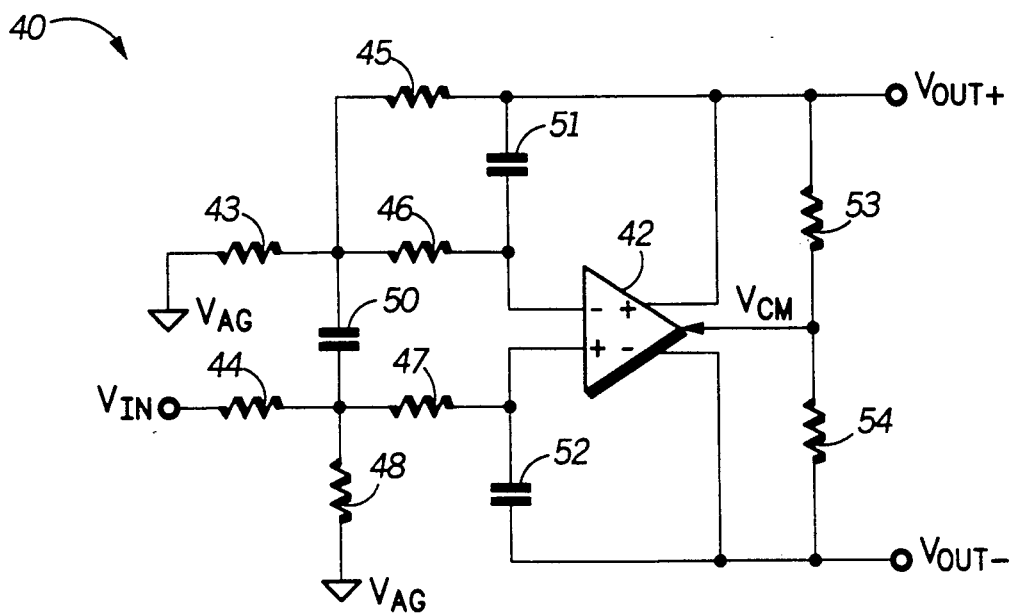
FIG. 2 illustrates in schematic form a single-ended input to differential output amplifier with an integral two-pole filter in accordance with the present invention.

Shown in FIG. 2 is a single ended input to differential output amplifier filter circuit 40. Circuit 40 comprises an operational amplifier 42, resistors 43-48, capacitors 50-52, and resistors 53 and 54. Operational amplifier 42 has a negative input terminal, a positive input terminal, a positive output terminal for providing a signal labelled "$V_{OUT+}$", a negative output terminal for providing a signal labelled "$V_{OUT-}$", and a common mode feedback input terminal. Resistor 43 has a first terminal connected to $V_{AG}$, and has a second terminal. Resistor 44 has a first terminal for receiving a signal labelled "$V_{IN}$", and has a second terminal. Resistor 45 has a first terminal connected to the second terminal of resistor 43, and has a second terminal connected to the positive output terminal of operational amplifier 42. Resistor 46 has a first terminal connected to the second terminal of resistor 43, and has a second terminal connected to the negative input terminal of operational amplifier 42. Resistor 47 has a first terminal connected to the second terminal of resistor 44, and has a second terminal connected to the positive input terminal of operational amplifier 42. Resistor 48 has a first terminal connected to the second terminal of resistor 44, and has a second terminal connected to a reference voltage labelled "$V_{AG}$". Capacitor 50 has a first terminal connected to the second terminal of resistor 43, and has a second terminal connected to the second terminal of resistor 44. Capacitor 51 has a first terminal connected to the positive output terminal of operational amplifier 42, and has a second terminal connected to the negative input terminal of operational amplifier 42. Capacitor 52 has a first terminal connected to the positive input terminal of operational amplifier 42, and has a second terminal connected to the negative output terminal of operational amplifier 42. For purposes of illustration, assume that circuit 20 is implemented with resistors 43 and 44 having equal values, resistors 46 and 47 having equal values, resistors 45 and 48 having equal values, and capacitors 51 and 52 having equal values.

In operation, circuit 40 performs several functions. First, it converts a single-ended input signal into a differential output signal, with either gain or attenuation as desired by properly choosing the values of the resistors. Second, circuit 40 provides for cancellation of the second harmonic distortion caused by the nonlinear resistance characteristics of diffused resistors. This function is taught by Westwick in U.S. Pat. No. 4,720,686 entitled "Circuit for Converting a Fully Differential Amplifier to a Single-Ended Output Amplifier" and assigned to the assignee hereof, herein incorporated by reference. Third, circuit 40 performs a two-pole lowpass filtering function on the input signal with significant reduction in capacitor area. Circuit 40 performs its transfer function in a manner that allows both capacitor 51 and capacitor 52 to be halved in size from a corresponding capacitor in the circuit taught in U.S. Pat. No. 4,782,305, resulting in substantial savings in integrated circuit area. Because of its characteristics, circuit 40 is well-suited for providing input signal conditioning for a fully differential sampled data system, such as a switched capacitor filter or an analog-to-digital (A/D) converter.

The term "single-ended" as used herein means referenced to a fixed potential. In circuit 40, the fixed potential is $V_{AG}$, the analog ground reference potential. Operational amplifier 42 used in circuit 40 is somewhat different than operational amplifier 22 in FIG. 1 in that it is fully differential, receiving a differential input, and providing a differential output. In addition, a common mode feedback signal labelled "$V_{CM}$" is fed back into amplifier 42. One fully differential operational amplifier with a common mode feedback input terminal which may be used as operational amplifier 40 is taught by Whatley in U.S. Pat. No. 4,573,020 entitled "Fully Differential Operational Amplifier with D.C. Common-Mode Feedback", and assigned to the assignee hereof, but other amplifiers are possible. Also, the common mode feedback input terminal may be omitted when other amplifiers, which may use different methods of sensing and setting the common mode output voltage, are used. Amplifier 42 changes a common mode voltage between the positive output terminal and the negative output terminal of operational amplifier 42 in response to a difference in voltage between a reference voltage and $V_{CM}$. Equilibrium is reached when $V_{CM}$ equals the reference voltage. Typically, the reference voltage used is $V_{AG}$, but this is not necessarily true as taught by Westwick in U.S. Pat. No. 4,720,686, referenced above.

The common mode component of the differential signal between $V_{OUT+}$ and $V_{OUT-}$ is sensed by resistors 53 and 54. The two resistors 53 and 54 in essence average the differential signal to provide $V_{CM}$. The values of resistors 53 and 54 should be equal. It can be readily shown by nodal analysis that the gain transfer function for circuit 40 in the frequency (s) domain may be represented as:

$$V_{OUT}/V_{IN} = [(A)(b_0')/s^2 + b_1's + b_0')] \quad (4)$$

where:

$$b_0' = (1)/[(2)(C_{50})(2)(C_{51})(R_{45})(R_{46})] \quad (5)$$

wherein $R_{45}$ and $R_{46}$ are the resistive values of resistors 45 and 46, respectively, $V_{OUT}$ is equal to $(V_{OUT+} - V_{OUT-})$, $V_{IN}$ is equal to $(V_{IN+} - V_{IN-})$, and $C_{50}$ and $C_{51}$ are the capacitive values of capacitors 50 and 51, respectively. The expression $b_1'$ of equation (4) may be defined as $$b_1' = [1/(2)(C_{50})][(1/R_{43}) + (1/R_{45}) + (1/R_{46})] \quad (6)$$

wherein $R_{43}$ is the resistive value of resistor 43. The term "A38 in equation (4) is the D.C. gain of circuit 20 and is equal to $(2R_{45})/R_{43}$. The D.C. gain here is also determined by a single resistive ratio and may be made very stable when implemented with conventional diffusion resistors. The transfer function, equation (2), is a second order equation in s, and therefore the frequency response is a two pole function.

By comparing the factor $b_0$ of equation (2) with $b_0'$ of equation (5), it can be seen that the value of $b_0'$ for circuit 40 of FIG. 2 in equation (5) is half the value of $b_0$ for circuit 20 of FIG. 1 in equation (2), if elements 23-28 and 30-32 have the same values as their corresponding elements 43-48 and 50-52. Therefore, for a given frequency response characteristic, the value of both $C_{51}$ and $C_{52}$ may be halved. In other embodiments in which the assumption that $(C_{51}=C_{52})$ is not maintained, it is possible that the sizes of $C_{51}$ and $C_{52}$ may be reduced in some other proportions to still maintain the given frequency response characteristic. Circuit 40, therefore, requires less capacitor area and less integrated circuit area than circuit 20 of FIG. 1.

It should be apparent by now that a single-ended input to differential output amplifier with an integral two-pole filter has been provided. The circuit 40 performs three functions: it converts a single-ended input signal into a differential output signal, with either gain or attenuation as desired by properly choosing the values of the components; it provides for concellation of the second harmonic distortion caused by the nonlinear resistance characteristics of diffused resistors; and it performs a two-pole lowpass filtering function on the input signal which significantly reduces capacitor area. The transfer function of the circuit 40 is such that a capacitor value, and hance size, may be halved to maintain a given frequency response when compared to the frequency response of a known circuit.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A circuit which receives a single-ended input signal and implements a predetermined transfer function to provide a differential output signal, comprising:
    an amplifier having first and second input terminals, and first and second output terminals;
    first circuit means coupled to said amplifier for receiving a reference voltage, said first circuit means implementing a first part of the predetermined transfer function and comprising:
        a first resistor having a first terminal for receiving said reference voltage, and a second terminal;
        a second resistor having a first terminal coupled to said second terminal of said first resistor, and a second terminal coupled to said first output terminal of said amplifier;
        a third resistor having a first terminal coupled to said second terminal of said first resistor, and a second terminal coupled to said first input terminal of said amplifier;
        a first capacitor having a first terminal coupled to said first input of said amplifier, and a second terminal coupled to said first output of said amplifier;
    second circuit means coupled to said amplifier for receiving said single-ended input signal, said second circuit means implementing a second part of said predetermined transfer function;
    a second capacitor coupled between said first circuit means and said second circuit means for implementing a third part of the predetermined transfer function, said second capacitor utilizing a voltage between said single-ended input signal and said reference voltage; and
    common mode sensing means coupled between said first and second output terminals, for sensing and providing to said amplifier a common mode voltage having a value between a signal voltage on said first output terminal of said amplifier and a signal voltage on said second output terminal of said amplifier.

2. The circuit of claim 1 wherein said second circuit means comprises:
    a fourth resistor having a first terminal for receiving the single-ended input signal, and a second terminal;
    a fifth resistor having a first terminal coupled to said second terminal of said fourth resistor, and a second terminal coupled to said second input terminal of said amplifier;
    a sixth resistor having a first terminal coupled to said second terminal of said fourth resistor, and a second terminal for receiving said reference voltage; and
    a third capacitor having a first terminal coupled to said second input terminal of said amplifier, and a second terminal coupled to said second output terminal of said amplifier.

3. The circuit of claim 2 wherein said first input terminal of said amplifier is a negative input terminal, and wherein said second input terminal is a positive input terminal of said amplifier.

4. The circuit of claim 3 wherein said first output terminal of said amplifier is a positive output terminal, and wherein said second output terminal is a negative output terminal of said amplifier.

5. A circuit comprising:
    amplification means for providing a differential voltage between positive and negative output signals proportional to a difference in voltage between a positive input terminal and a negative input terminal of said amplification means, and for changing a common mode voltage between said positive and negative output signals in response to a difference between a first reference voltage and a common mode feedback signal;
    common mode feedback means coupled to said amplification means, for providing said common mode feedback signal in response to a sensed common mode voltage between said positive output terminal and said negative output terminal;
    a first resistor having a first terminal coupled to a second reference voltage, and a second terminal;
    a second resistor having a first terminal for receiving a single-ended input signal, and a second terminal;
    a third resistor having a first terminal coupled to said second terminal of said first resistor, and a second terminal coupled to said negative input terminal of said amplification means;
    a fourth resistor having a first terminal coupled to said second terminal of said second resistor, and a second terminal coupled to said positive input terminal of said amplification means;
    a first capacitor having a first electrode coupled to said second terminal of said first resistor, and a second electrode coupled to said second terminal of said second resistor;

a fifth resistor having a first terminal coupled to said second terminal of said first resistor, and a second terminal coupled to said positive output signal;

a second capacitor having a first electrode coupled to said positive output signal, and a second electrode coupled to said negative input terminal of said amplifier;

a sixth resistor having a first terminal coupled to said second terminal of said second resistor, and a second terminal coupled to said second reference voltage; and a third capacitor having a first electrode coupled to said positive input terminal of said amplifier, and a second electrode coupled to said negative output signal.

6. The circuit of claim 5 wherein said first and second resistors have substantially equal resistances, said third and fourth resistors have substantially equal resistances, and said fifth and sixth resistors have substantially equal resistances.

7. The circuit of claim 5 wherein said second and third capacitors have substantially equal capacitances.

8. The circuit of claim 5 wherein said first and second reference voltages are substantially equal.

9. A circuit a comprising:
an amplifier having positive and negative input terminals, and positive and negative output terminals;

a first resistor having a first terminal for receiving a first voltage, and a second terminal;

a second resistor having a first terminal for receiving a second voltage, and a second terminal;

a third resistor having a first terminal coupled to said second terminal of said first resistor, and a second terminal coupled to said negative input terminal of said amplifier;

a fourth resistor having a first terminal coupled to said second terminal of said second resistor, and a second terminal coupled to said positive input terminal of said amplifier;

a first capacitor having a first electrode coupled to said second terminal of said first resistor, and a second electrode coupled to said second terminal of said second resistor;

a fifth resistor having a first terminal coupled to said second terminal of said first resistor, and a second terminal coupled to said positive output terminal;

a second capacitor having a first electrode coupled to said positive output terminal of said amplifier, and a second electrode coupled to said negative input terminal of said amplifier;

a sixth resistor having a first terminal coupled to said second terminal of said second resistor, and a second terminal coupled to a reference voltage;

a third capacitor having a first electrode coupled to said positive input terminal of said amplifier, and a second electrode coupled to said negative output terminal of said amplifier; and common mode means, coupled to said amplifier, for providing a common mode feedback signal to said amplifier.

10. The circuit of claim 9 wherein said common mode means is coupled between said positive and negative output terminals of said amplifier, and senses and provides to said amplifier said common mode feedback signal at a voltage having a value between a signal voltage on said positive output terminal of said amplifier and a signal voltage on said negative output terminal of said amplifier.

11. The circuit of claim 10 wherein said common mode means comprises:
a seventh resistor having a first terminal coupled to said positive output terminal of said amplifier, and a second terminal providing said common mode feedback signal; and an eighth resistor having a first terminal coupled to said second terminal of said seventh resistor, and a second terminal coupled to said negative output terminal of said amplifier.

* * * * *